(12) United States Patent
Chen et al.

(10) Patent No.: US 8,350,380 B2
(45) Date of Patent: Jan. 8, 2013

(54) METHOD FOR MANUFACTURING LEADFRAME, PACKAGING METHOD FOR USING THE LEADFRAME AND SEMICONDUCTOR PACKAGE PRODUCT

(75) Inventors: Nan-Jang Chen, Hsinchu (TW); Hong-Chin Lin, Tai-Chung (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 13/346,641

(22) Filed: Jan. 9, 2012

(65) Prior Publication Data

US 2012/0104588 A1 May 3, 2012

Related U.S. Application Data

(63) Continuation of application No. 11/964,054, filed on Dec. 26, 2007, now Pat. No. 8,124,461.

(60) Provisional application No. 60/871,993, filed on Dec. 27, 2006.

(51) Int. Cl.
*H01L 21/00* (2006.01)

(52) U.S. Cl. ........ 257/701; 257/673; 438/113; 438/123; 438/127

(58) Field of Classification Search .................. 438/113, 438/123, 127; 257/673, 701
See application file for complete search history.

(56) References Cited

U.S. PATENT DOCUMENTS

| | | | |
|---|---|---|---|
| 5,504,370 A | 4/1996 | Lin | |
| 5,773,878 A | 6/1998 | Lim | |
| 6,160,307 A | 12/2000 | Kweon | |
| 6,162,365 A | 12/2000 | Bhatt | |
| 6,238,952 B1 | 5/2001 | Lin | |
| 6,335,564 B1 | 1/2002 | Pour | |
| 6,384,478 B1 | 5/2002 | Pour | |
| 6,483,178 B1 | 11/2002 | Chuang | |
| 6,608,367 B1 | 8/2003 | Gibson et al. | |
| 6,621,140 B1 | 9/2003 | Gibson et al. | |
| 6,713,322 B2 | 3/2004 | Lee | |
| 6,765,284 B2 | 7/2004 | Gibson | |
| 6,818,973 B1 | 11/2004 | Foster | |
| 6,841,414 B1 | 1/2005 | Hu | |
| 6,876,068 B1 | 4/2005 | Lee | |
| 6,927,481 B2 | 8/2005 | Gibson | |
| 6,927,483 B1* | 8/2005 | Lee et al. | 257/676 |
| 6,946,324 B1 | 9/2005 | McLellan | |
| 6,995,459 B2 | 2/2006 | Lee | |
| 7,005,326 B1 | 2/2006 | Glenn | |
| 7,183,134 B2 | 2/2007 | Lee | |
| 7,323,773 B2 | 1/2008 | Hayashi | |
| 7,405,468 B2* | 7/2008 | Masuda et al. | 257/676 |
| 7,521,294 B2 | 4/2009 | Lee | |
| 7,656,039 B2 | 2/2010 | Kuroda | |

(Continued)

FOREIGN PATENT DOCUMENTS

CN 1481019 A 3/2004

(Continued)

*Primary Examiner* — Jarrett Stark
*Assistant Examiner* — Nicholas Tobergte
(74) *Attorney, Agent, or Firm* — Winston Hsu; Scott Margo

(57) ABSTRACT

A leadframe package includes a die pad with four unitary, outwardly extending slender bars; a plurality of leads arranged along periphery of the die pad; a separate pad segment separated from the die pad and isolated from the plurality of leads; a semiconductor die mounted on an upper side of the die pad, wherein the semiconductor die contains first bond pads wire-bonded to respective the plurality of leads and a second bond pad wire-bonded to the separate pad segment; and a molding compound encapsulating the semiconductor die, the upper side of the die pad, the first suspended pad segment and inner portions of the plurality of leads.

12 Claims, 20 Drawing Sheets

| U.S. PATENT DOCUMENTS | | | | FOREIGN PATENT DOCUMENTS | | |
|---|---|---|---|---|---|---|
| 2001/0008305 A1 | 7/2001 | McLellan | | JP | 3166755 | 7/1991 |
| 2003/0164554 A1 | 9/2003 | Fee | | JP | 3166756 | 7/1991 |
| 2003/0203539 A1 | 10/2003 | Islam | | JP | 1187607 | 3/1999 |
| 2005/0139969 A1 | 6/2005 | Lee | | TW | I248184 | 1/2006 |
| 2005/0224937 A1 | 10/2005 | Lee | | | | |
| 2005/0287710 A1 | 12/2005 | Huang | | * cited by examiner | | |

METHOD FOR MANUFACTURING LEADFRAME, PACKAGING METHOD FOR USING THE LEADFRAME AND SEMICONDUCTOR PACKAGE PRODUCT

CROSS REFERENCE TO RELATED APPLICATIONS

This application is a continuation application of U.S. patent application Ser. No. 11/964,054 filed Dec. 26, 2007, which claims the benefit of U.S. provisional application No. 60/871,993 filed Dec. 27, 2006.

BACKGROUND OF THE INVENTION

1. Field of the Invention

The present invention relates to a leadframe used for semiconductor devices and more particularly, to a leadframe package with multiple exposed pads and method for fabricating the same.

2. Description of the Prior Art

Semiconductor dies are conventionally enclosed in plastic packages that provide protection from hostile environments and enable electrical interconnection between the semiconductor die and a substrate such as a printed circuit board (PCB). Such an integrated circuit (IC) package includes a metal leadframe, a semiconductor die mounted on a unitary die pad of the leadframe, and bond wires electrically connecting bond pads on the semiconductor die to individual leads of the leadframe. The leadframe and the semiconductor die are eventually encapsulated in a molding compound.

The technology trends in the back-end packaging industry can be summarized as "more functionality in a smaller space". The functionality of the integrated circuit chips is becoming more and more complicated, leading to increased number of external connection pins of the leadframe package. As the pin count is increased, the cost of packaging each die is increased accordingly. To avoid an undesirable increase in the size of the package attributable to the increased number of connection pins or leads, one approach is reducing the lead pitch. However, narrowing the lead pitch results in increase in the level of mutual inductance and mutual capacitance generated from the leads of the package. Thus, leadframe packages are typically considered to be unsuitable for high-speed semiconductor dies, which transmit signals at high speeds, since the relatively high inductance and capacitance may distort the transmitted signals.

In this regard, many mobile communication devices (e.g., cellular phones) and personal communication devices which are equipped with semiconductor dies capable of transmitting high-frequency signals typically are outfitted with BGA (ball grid array) packages which accommodate such semiconductor dies. If such semiconductor dies were to be installed or packaged in a leadframe package, significant signal loss or noise such as AC noise becomes a problem.

However, the drawback of the BGA package is that it is relatively more expensive than the leadframe package, and the product turn-around-time (TAT) of the BGA package is longer. Besides, one challenge of developing radio-frequency system-on-a-chip (RF-SoC) is the difficulty in lowering power consumption of RF and analogy circuits and reducing the size of passive components and analog transistors.

Therefore, there is a strong need in this industry to provide an improved leadframe structure and leadframe package, which are cost-effective and are particularly suited for high-speed semiconductor dies and are capable of alleviating signal loss or noise when transmitting high-frequency signals.

SUMMARY OF THE INVENTION

A first preferred embodiment is a method for packaging a semiconductor device. The method includes the following steps: mounting the semiconductor device on a primary portion of a die pad of a leadframe, the die pad further comprising at least one secondary portion and at least one separating portion, the primary portion and the secondary portion being connected via the separating portion; wiring a set of signal lines from the semiconductor device to leads of leadframe; encapsulating the semiconductor device and the leadframe with a molding compound wherein the bottom side of the die pad is exposed outside the molding compound; and applying a separating etching, drilling or carving on the separating portion so as electrically disconnect the primary portion and the secondary portion.

A secondary preferred embodiment is a method for manufacturing a leadframe used for packaging a semiconductor device. The method includes: patterning a leadframe on a metal plate; manufacturing a preliminary leadframe; defining a primary portion, at least one secondary portion and at least one separating portion on the preliminary leadframe with mask; and performing a preliminary etching the separating portion so that the thickness of the separating portion is smaller than the thicknesses of the primary portion and the secondary portion.

A third preferred embodiment is a semiconductor package product. The semiconductor package product includes: a semiconductor device; a die pad having a primary portion and at least one secondary portion, the primary portion carrying the semiconductor device; multiple leads for connecting a set of signal lines wired to the semiconductor device; and a molding compound for encapsulating the semiconductor device, the die pad and a portion of the leads and for exposing a bottom side of the primary and secondary portions, wherein there are more than two signal lines of a secondary set of signal lines wired from the semiconductor device to the secondary portion and the secondary set of signal lines are electrically connected to a signal terminal of a circuit board via the exposed bottom side.

With these embodiments, e.g. improved leadframe and its manufacturing process, semiconductor package produces have more spare leads to be used, less noise interference and better electronic signal quality.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The improved leadframe package structure, as described below, is suited for the applications including, but not limited to, LQFP (Low-Profile Quad Flat Pack) packaging, TQFP (Thin Quad Flat Pack) packaging, QFN (Quad Flat Non-leaded) packaging, DFN (Dual Flat No-lead) packaging, multi-zone QFN, and multi-die flip-chip packaging.

The present invention is capable of pushing the limits of conventional leadframe package by sparing or releasing a number of the leads that were used to be wire bonded to ground pads, power pads or some signal pads on a packaged semiconductor die. Besides, the present invention is capable of improving electrical performance of the integrated circuit package by utilizing separate grounding systems on the die pad.

Figure 1:
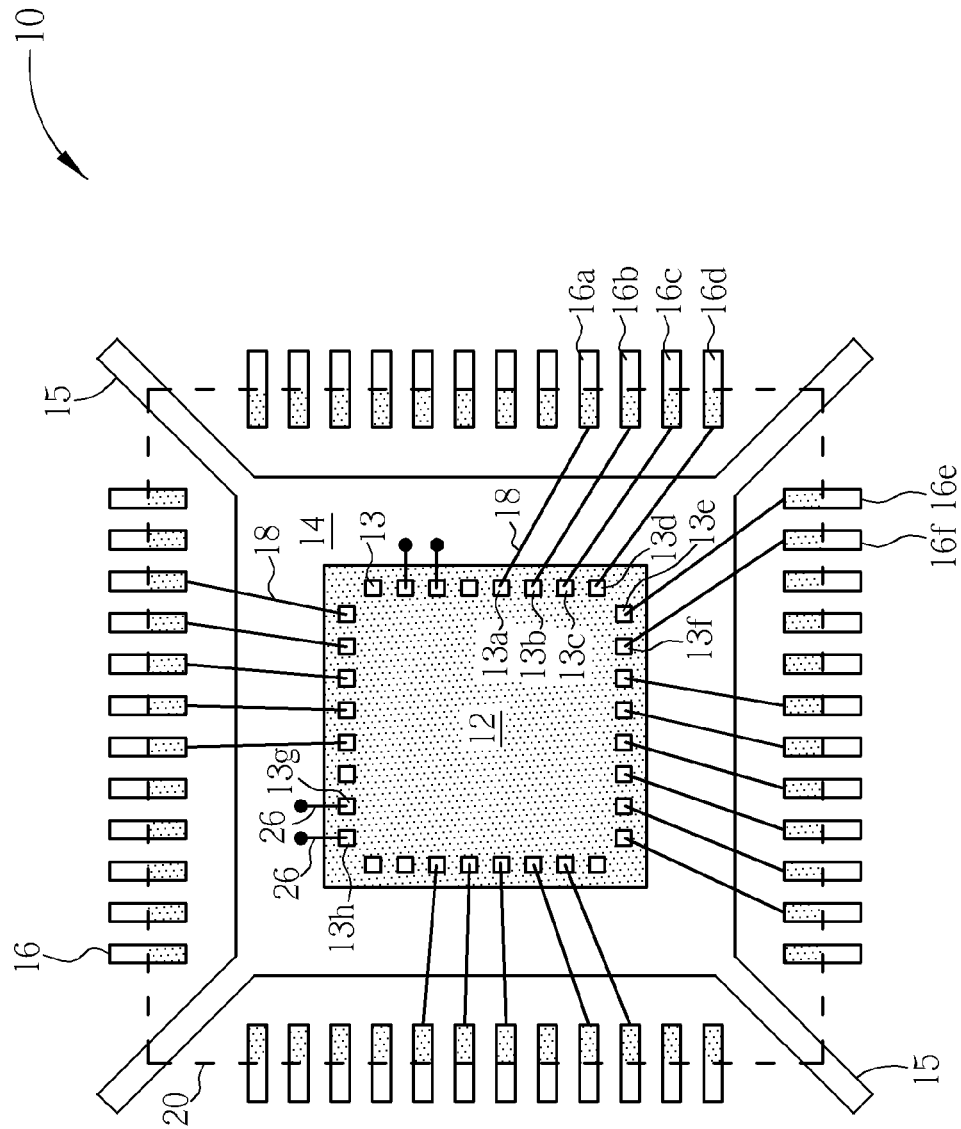
FIG. 1 illustrates a perspective top view of a typical leadframe package.

FIG. 1 illustrates a perspective top view of a leadframe package 10. As shown in FIG. 1, the leadframe package 10 includes a semiconductor die 12, an example of a semiconductor device, that is mounted on a die pad 14. A plurality of bond pads 13 are provided on a top surface of the semiconductor die 12. Each of the plurality of bond pads 13 is electrically connected to a corresponding lead 16 through a bond wire 18.

The bond pads 13, which are also known as input/output pads or I/O pads, generally comprises power pads 13a~13f, ground pads 13g and 13h, and signal pads, etc. The power pads 13a~13f are bonded to respective leads 16a~16f through the bond wires 18, which are signal lines. The ground pads 13g and 13h are bonded to the die pad 14 through the bond wires 26.

The leads 16, which are eventually mounted onto a socket of a printed circuit board (PCB), are disposed along four sides of the die pad 14. The semiconductor die 12, the die pad 14, inner ends of the leads 16 and the bond wires 18 are encapsulated in a molding compound 20.

In this example, the die pad 14 is a unitary, rectangular-shaped planar area with four slender supporting bars 15 extending outward from four corners of the die pad 14. But, please note that other shapes of die pad, e.g. a die pad without four slender supporting bars, may also be applied with the invention. A bottom side (not shown) of the die pad 14 is deliberately exposed in the package body to dissipate heat generated by the semiconductor die 12, which is known as Exposed die pad (abbr. E-pad) configuration. Typically, the exposed bottom side of the die pad 14 is electrically connected to a ground layer of the PCB.

However, it is disadvantageous in some SoC applications where the semiconductor die 12 has analog/digital mixed circuits and is capable of transmits high-frequency signals because the digital ground noise may adversely affect the analog signal path.

Figure 2:
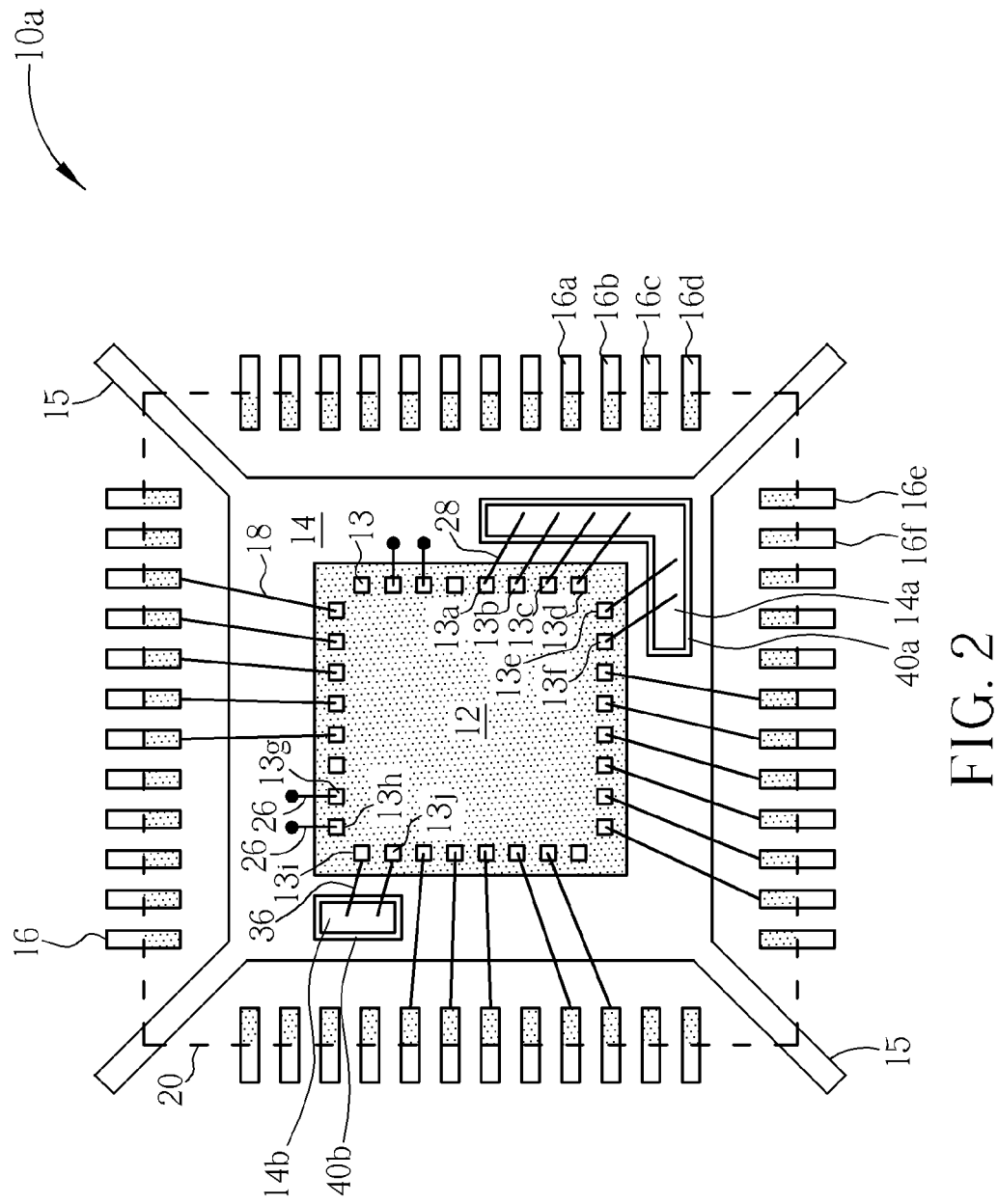
FIG. 2 is a schematic diagram illustrating a perspective top view of a leadframe package according to one preferred embodiment of this invention.
Figure 3:
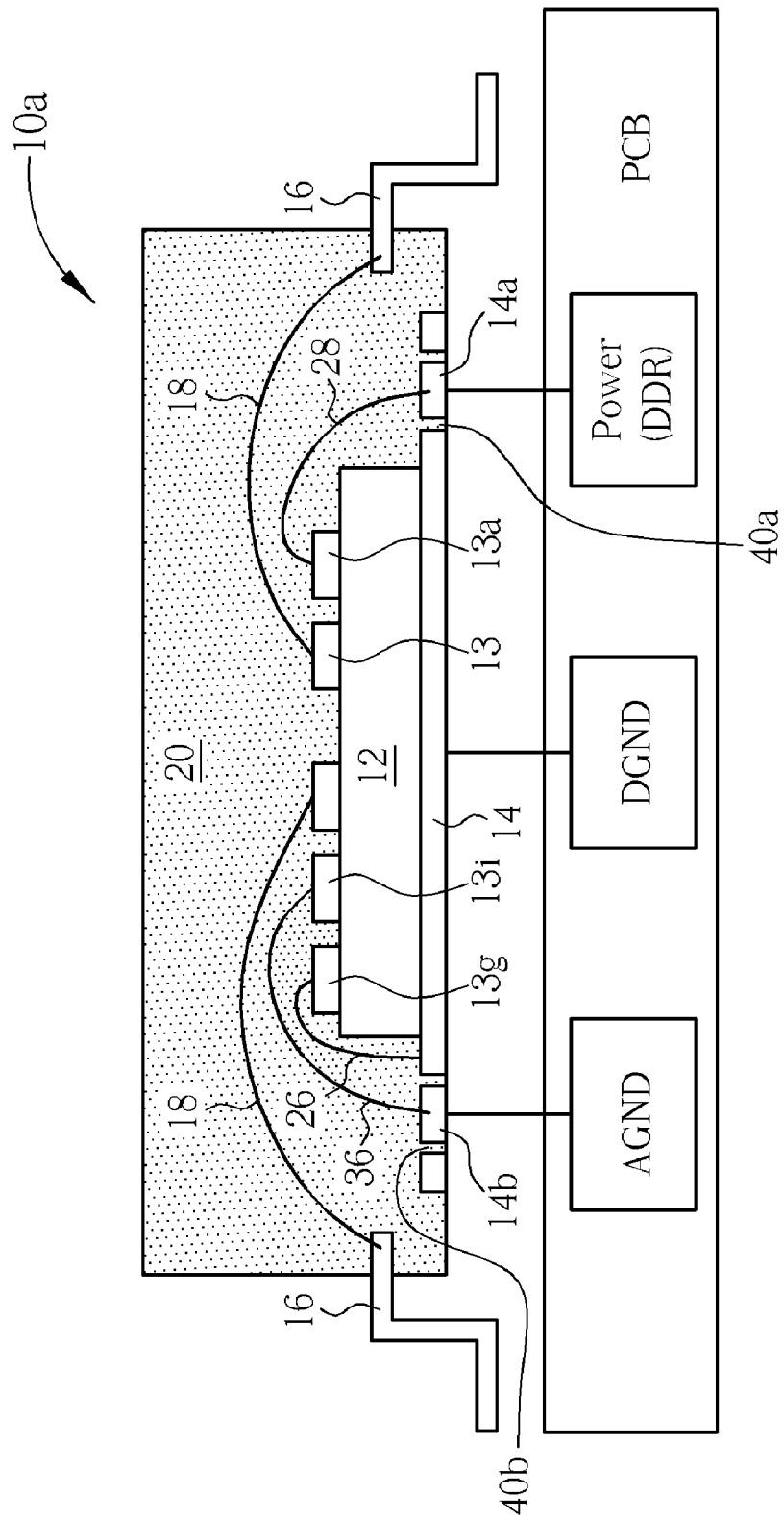
FIG. 3 is a schematic, cross-sectional diagram illustrating the leadframe package according to this invention.

Please refer to FIG. 2 and FIG. 3. FIG. 2 is a schematic diagram illustrating a perspective top view of a leadframe package 10a according to one preferred embodiment of this invention. FIG. 3 is a schematic, cross-sectional diagram illustrating the leadframe package 10a, wherein like numerals designate like components, regions or layers.

As shown in FIG. 2 and FIG. 3, the leadframe package 10a comprises a semiconductor die 12 that is mounted on a die pad 14 of copper or copper alloys such as C7025, A192 or the like. Likewise, a plurality of bond pads 13 are provided on a top surface of the semiconductor die 12. Some of the bond pads 13 are electrically connected to corresponding leads 16 through bond wires 18.

The bond pads 13 comprises power pads 13a~13f, digital ground pads 13g and 13h, analog ground pads 13i and 13j, and signal pads, etc. One distinct feature of the present invention is that the power pads 13a~13f are bonded to a separate pad segment 14a through shorter bond wires 28 instead of bonding to leads 16a~16f. By doing this, the leads 16a~16f, which are originally boned to respective power pads 13a~13f, can be spared for other uses, for example, connecting to other signal pads on the semiconductor die 12, or they can be just omitted to reduce the lead numbers and thus the size and cost of the leadframe package 10a.

From one aspect, the performance of the leadframe package 10a can be improved by omitting leads 16a~16f, which were used to be connected to power pads 13a~13f on the semiconductor die 12. This is because the lead pitch is increased and also because the signal-transmitting path between the die and PCB becomes shorter.

Another distinct feature of the present invention is that the separate pad segment 14a, which is partitioned off from the die pad 14, does not directly contact with the die pad 14 and is completely isolated from the die pad 14. In addition, the separate pad segment 14a does not directly contact with or supported by any of the leads 16. Therefore, the separate pad segment 14a does not consume any of the leads 16. Similar to the die pad 14, the bottom side of the separate pad segment 14a is also exposed in the package body such that the separate pad segment 14a can be electrically connected to a power layer of the PCB for providing power signals to the semiconductor die 12.

An additional feature of the present invention is that the digital ground pads 13g and 13h on the semiconductor die 12 are bonded to the die pad 14 through the bond wires 26, and the analog ground pads 13i and 13j on the semiconductor die 12 are bonded to a separate pad segment 14b through the bond wires 36.

According to this invention, the die pad 14 is connected to a digital ground signal while the separate pad segment 14b is connected to an analog ground signal. Such separate grounding systems on die pad prevent digital circuit noise from affecting the analog signal path. Besides, the analog ground pads 13i and 13j are grounded and wire bonded to the separate pad segment 14b, which means shorter signal-transmitting path than a path through the leads 16.

Likewise, the separate pad segment 14b, which is partitioned off from the die pad 14, does not directly contact with the die pad 14 and is completely isolated from the die pad 14.

As shown in FIG. 3, similar to the separate pad segment 14a, the separate pad segment 14b does not directly contact with any of the leads 16. More specifically, the separate pad segment 14b does not need any structural support from the leads 16 or the die pad 14. The slit 40a between the separate pad segment 14a and the die pad 14 and the slit 40b between the separate pad segment 14b and the die pad 14 are both filled with epoxy molding compound 20.

Please note that on the die pad 14, there are three types of portions, i.e. a primary portion, at least one secondary portions and at least one separating portions that separate the primary portion and the secondary portion. In FIG. 2, the separate pad segments 14a and 14b are examples of the secondary portion. The slits 40a and 40b are used as separating portions for separating the secondary portions like the separated pad segments 14a and 14b from a primary portion of the die pad 14.

The bottom side of the separate pad segment 14b is exposed in the package body such that the separate pad segment 14b can be electrically connected to an analog ground (AGND) layer of the PCB. The exposed bottom side of the die pad 14 is connected to a digital ground (DGND) layer. As previously mentioned, such separate grounding systems on die pad prevent digital circuit noise from affecting the analog signal path.

Figure 4:
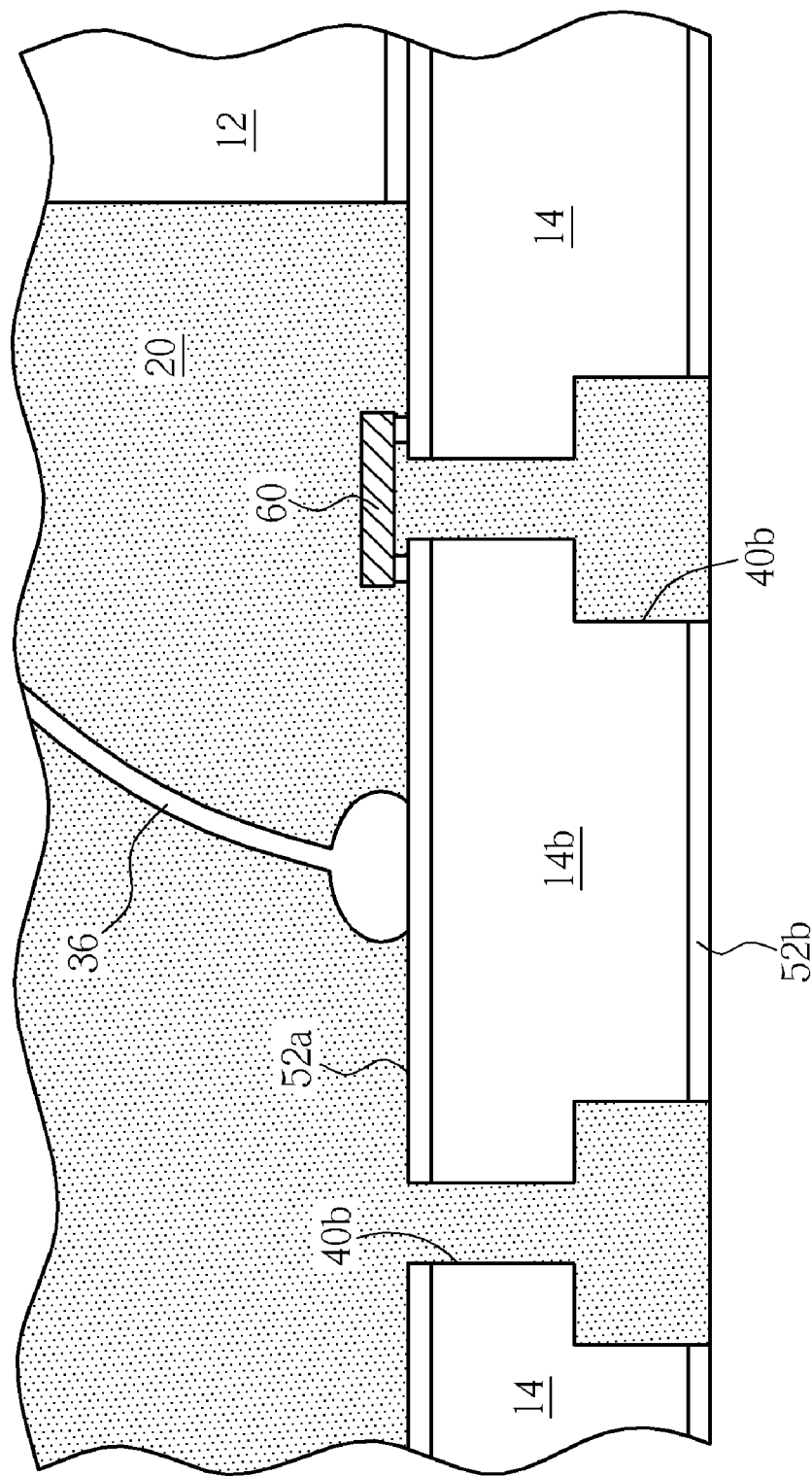
FIG. 4 is an enlarged, schematic diagram illustrating a cross-sectional view of the separate pad segment and the slit encircling the separate pad segment according to this invention.

FIG. 4 is an enlarged, schematic diagram illustrating a cross-sectional view of the separate pad segment 14a and the slit 40b encircling the separate pad segment 14b according to this invention. As shown in FIG. 4, a layer of plated noble metal 52a, such as gold, silver, palladium, platinum, iridium, rhenium, ruthenium, osmium, nickel silver, nickel gold or combinations thereof, is disposed on the molded upper side (die side) of the die pad 14 and the separate pad segment 14b. The exposed bottom sides (PCB side) of the die pad 14 and the separate pad segment 14a are both coated by a layer of noble metal 52b. A passive component 60 may be mounted between the pads 14 and 14b across the slit 40b for decoupling, ESD (electrostatic discharge) or other specific circuit (e.g., filter or matching) designs purposes.

It is another feature of this embodiment that the slit 40b (or slit 40a) has a reverse T-shaped cross-section. The epoxy molding compound 20 fills the reverse T-shaped slit 40b, which meliorates the reliability and deformation of the leadframe body. Due to the reverse T-shaped slit 40b, the injected molding compound 20 can tightly hold the suspended separate pad segment 14b in place.

Figure 5:
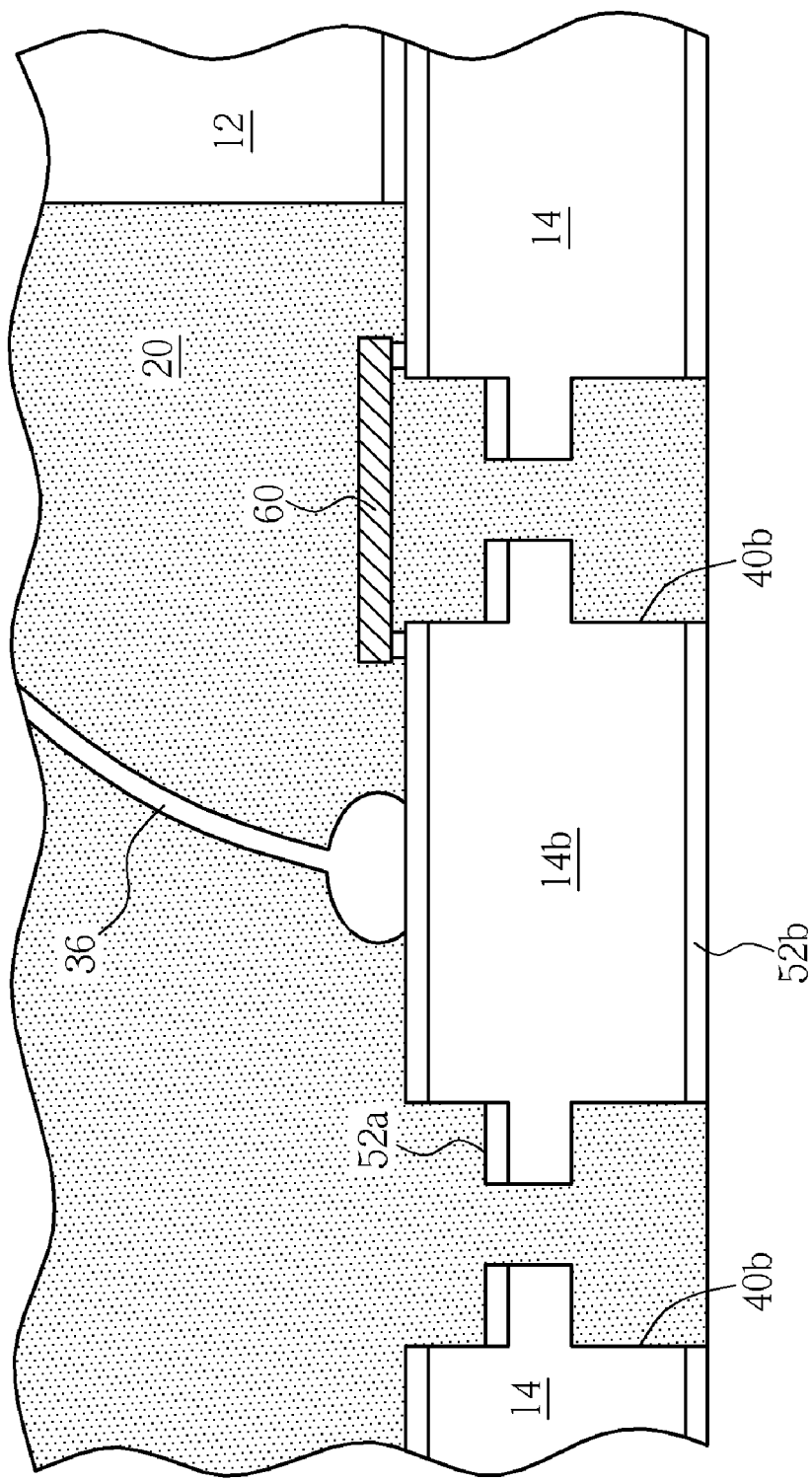
FIG. 5 illustrates a variant of the slit according to this invention.
Figure 6:
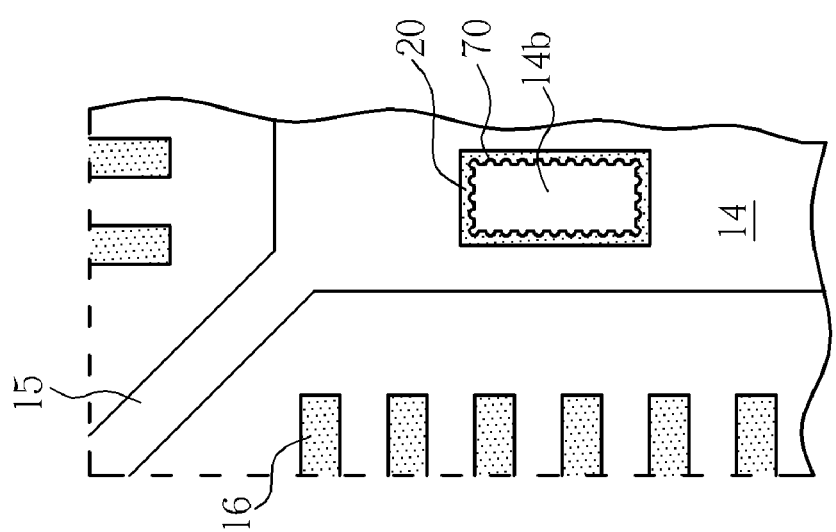
FIG. 6 illustrates another variant of the slit according to this invention.

FIG. 5 illustrates a variant of the slit 40b (or 40a). As shown in FIG. 5, the sandglass-shaped slit 40b has a ladder-shaped upper portion on the molded upper side or die side. FIG. 6 illustrates another variant of the slit 40b (or 40a). As shown in FIG. 6, the separate pad segment 14b has saw-tooth-like edges 70. This enhances the adhesion between the separate pad segment 14b and the molding compound 20 that fills into the slit 40b.

Figure 7:
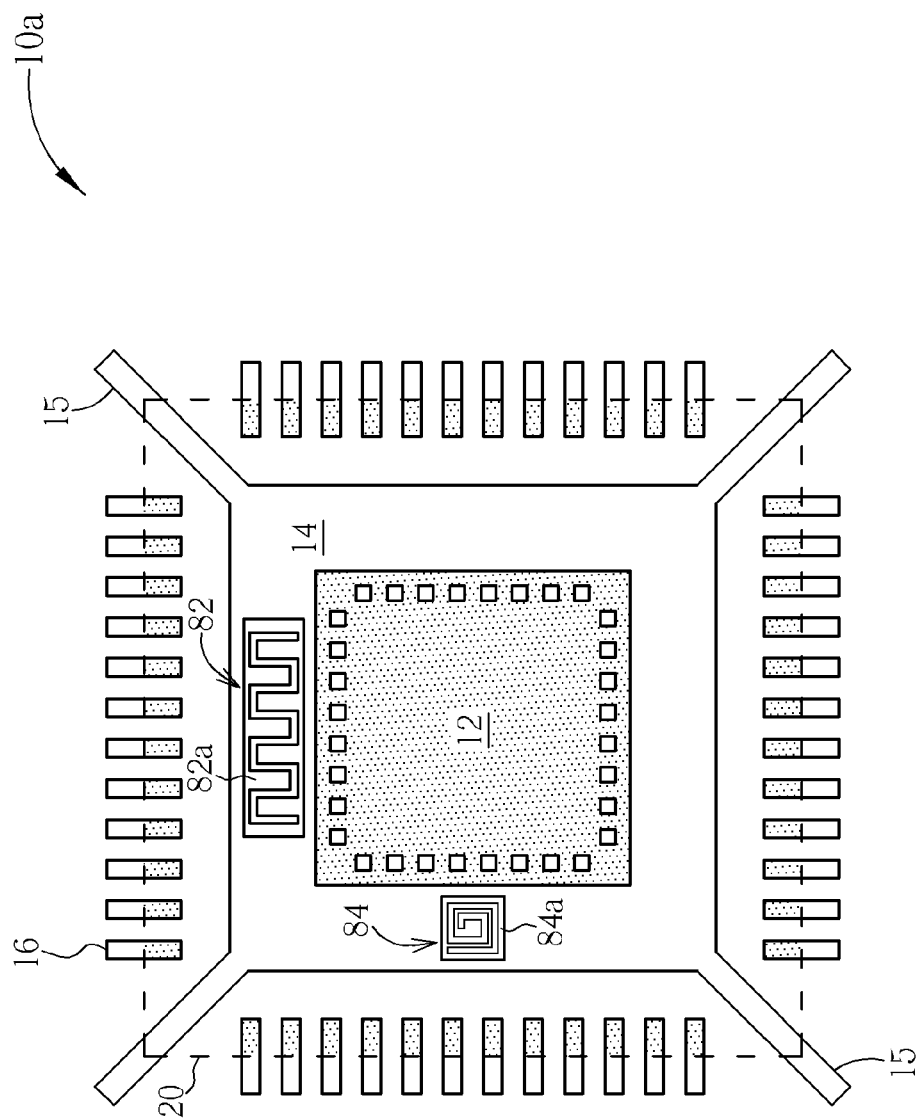
FIG. 7 illustrating the die pad and exemplary inductive segments thereon according to this invention.

FIG. 7 illustrates the die pad 14 and exemplary inductive segments 82 and 84 thereon according to this invention. The serpentine inductive segment 82 and spiral-shaped inductive segment 84, which can be used to form on-pad inductors, are integrally formed with the die pad of the leadframe. The serpentine inductive segment 82 and spiral-shaped inductive segment 84 do not directly contact with the die pad 14. More specifically, the inductive segments 82 and 84 do not need any structural support from the leads 16 or the die pad 14.

Epoxy molding compound is filled into the slit 82a between the serpentine inductive segment 82 and the die pad 14 and into the slit 84a between the spiral-shaped inductive segment 84 and the die pad 14. The slits 82a and 84a may have reverse T-shaped cross-section as set forth in FIG. 4.

Since the inductive segments 82 and 84 are not connected the leads 16, the inductors thereof has high quality Q factor, reduced parasitic capacitance and lower resonance frequency.

Figure 8:
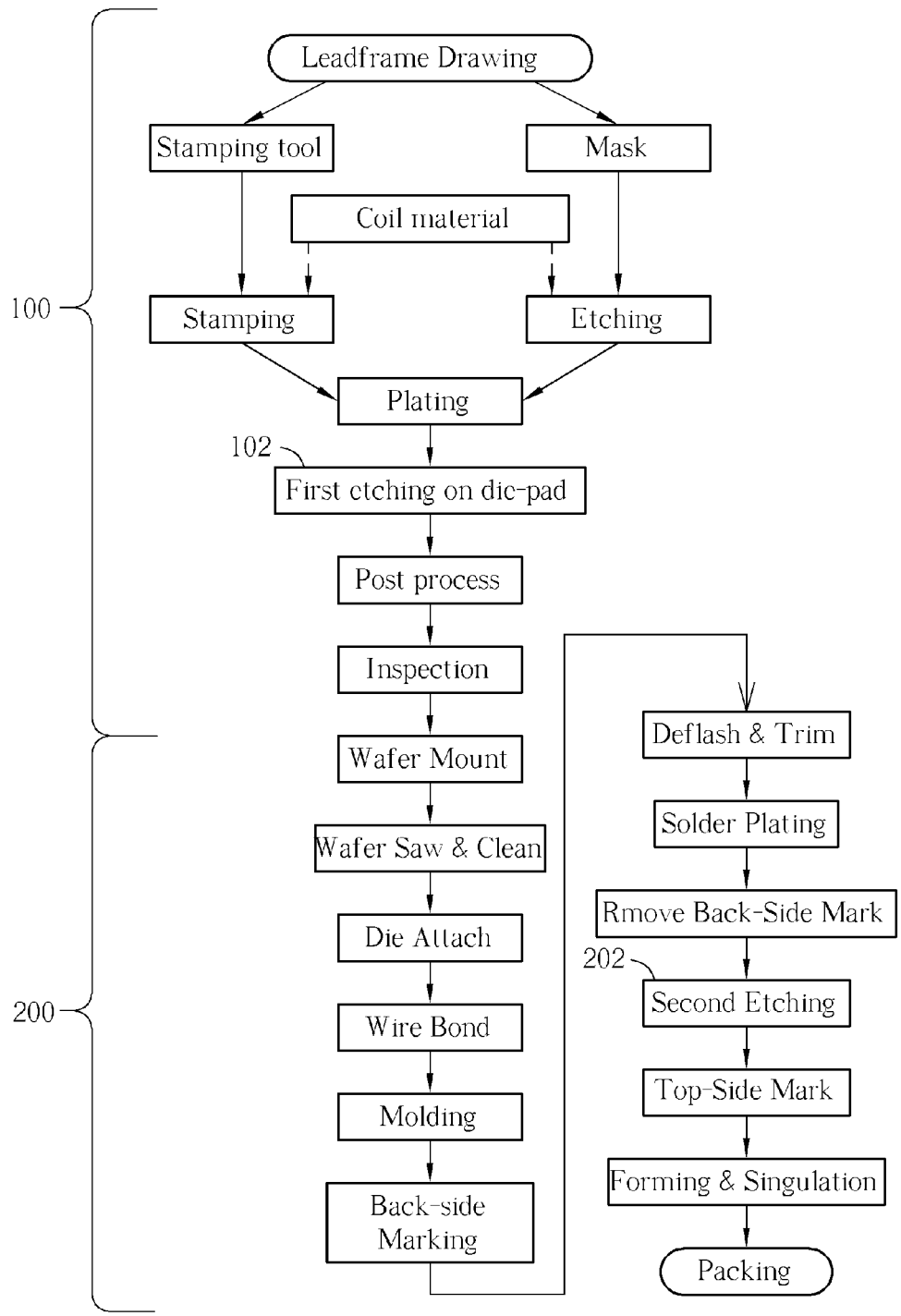
FIG. 8 depicts a flow chart demonstrating the manufacturing process of the leadframe having multiple die pads according to this invention.

FIG. 8 depicts a flow chart demonstrating the manufacturing process of the leadframe package having multiple exposed pads according to this invention. From one aspect, the present invention leadframe package may be fabricated using two-stage etching method. That is, the die pad is first half-etched (the step indicated by numeral number 102), also called "preliminary etching", during the first stage 100 by a leadframe manufacturing company and second half-etched (the step indicated by numeral number 202), also called "separating etching" during a second stage 200 by a subsequent assembly house after package molding is completed. The conventional leadframe package assembly process can be used except "Back-side Mark", "Removal of Back-side Mark", and "Etching" after "Molding" as shown in FIG. 8. "Back-side Mark" is to print with the artwork or photoresist on the connecting bars of the bottom metal for the purpose of plating (Sn) resistant. After the package is plated with tin (Sn) or noble metal except the connecting bars, the molded package with exposed leadframe is protected and resistant to corrosion. Then, the artwork or photoresist on the bottom side of connecting bars is removed. The connecting bars are etched away in the photochemical machine and each exposed pad is electrically isolated. The second half-etching partitions off and separates the pad segments 14a and 14b from the main die pad 14. Alternatively, the connecting bars can be drilled or carved away using the drilling machine or the PCB carving machine.

Figure 9:
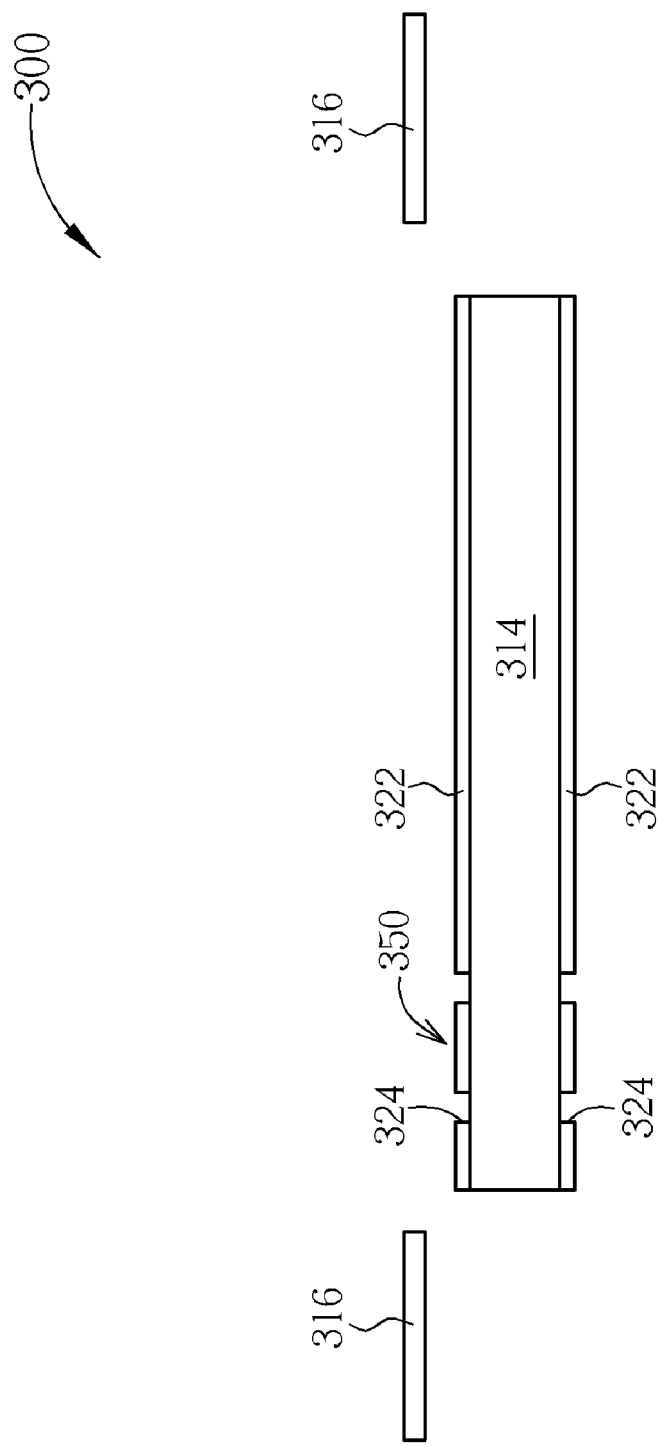
FIG. 9 to FIG. 13 are schematic, cross-sectional diagrams illustrating the intermediate steps during the fabrication of a leadframe package using two-stage etching method according this invention.

Please refer to FIG. 9 to FIG. 13, and briefly back to FIG. 8. FIG. 9 to FIG. 13 are schematic, cross-sectional diagrams illustrating the intermediate steps during the fabrication of a leadframe package using two-stage etching method according this invention. It is noted that the components or layers are not drawn to scale for the sake of clarity. As shown in FIG. 9, after etching (or stamping) and plating, a leadframe 300 is provided. The leadframe 300 comprises a unitary die pad 314 and peripheral leads 316. The both sides of the die pad 314 are coated with an etching mask 322 such as noble metals, metal alloys or photoresist. The etching mask 322 has slit openings 324, which define an isolated pad pattern 350 to be transferred into the underlying die pad 314.

Figure 10:
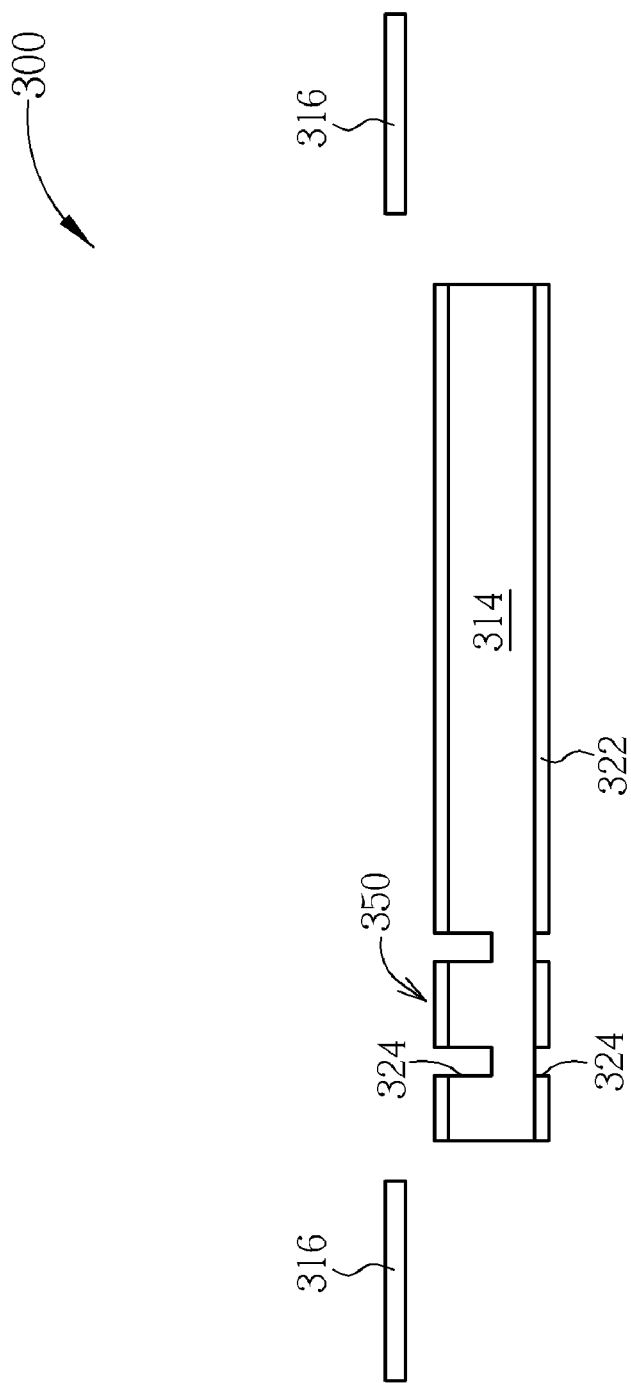

As shown in FIG. 10, a first half etching process is carried out on the die side to etch away a predetermined thickness of the die pad 314 through the slit openings of the etching mask 322. As previously mentioned, this first half etching process can be accomplished in a leadframe manufacturing company. The half-etched leadframe 300 is then shipped to an assembly house.

Figure 11:
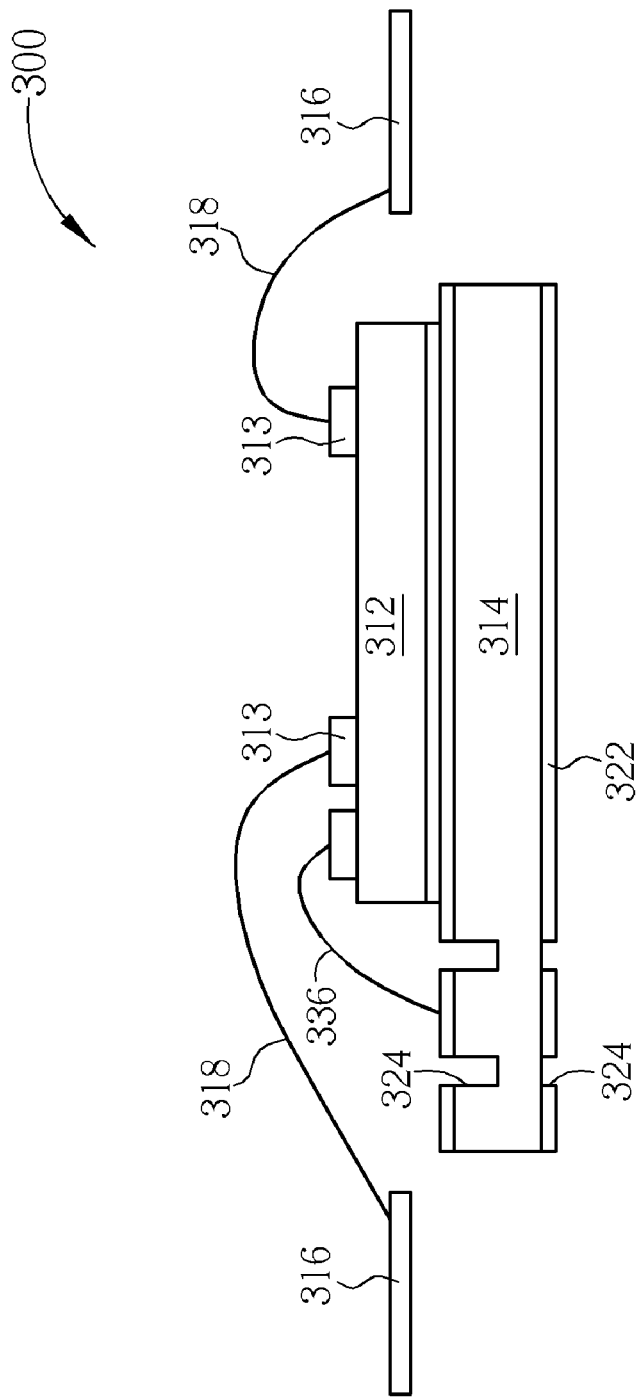

As shown in FIG. 11, in an assembly house, a semiconductor die 312 is attached onto the die pad 314. Bond wires 318 and 336 are provided to form electrically connection between the bond pads 313 and the leads 316 and between the bond pads 313 on the semiconductor die 312 and the die pad 314.

Figure 12:
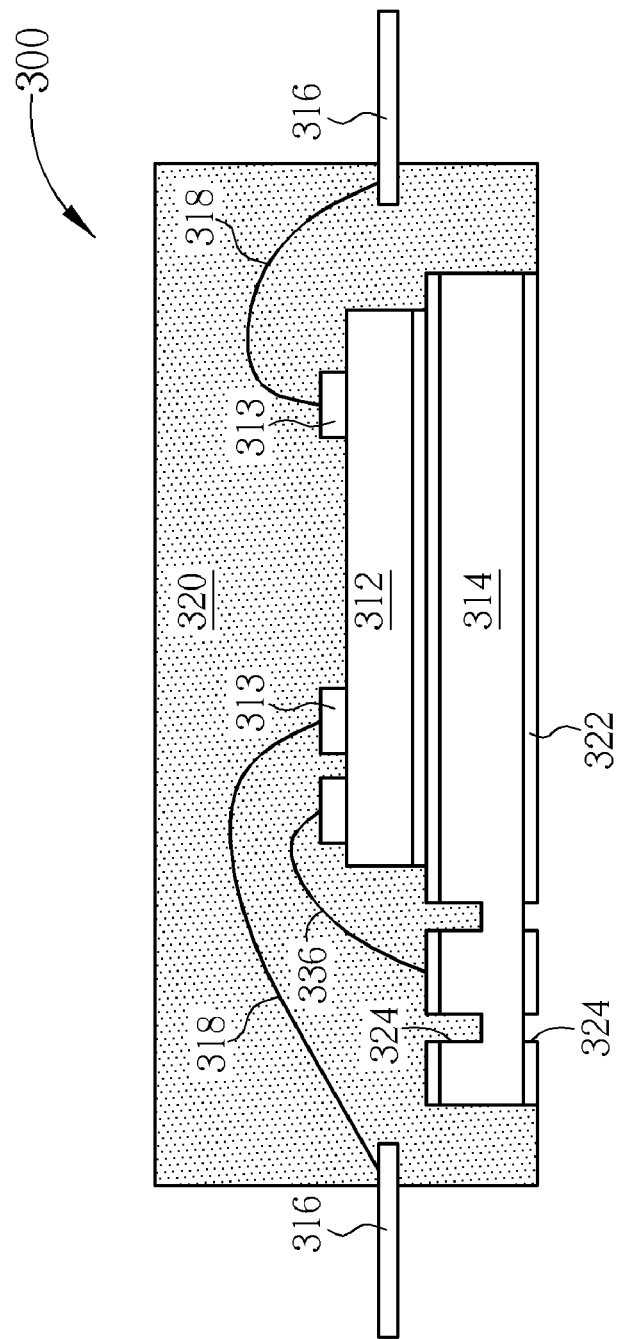

As shown in FIG. 12, after wire bonding, the entire assembly as depicted in FIG. 11 is molded using a thermosetting compound 320. This compound may be a low-temperature hardening resin. Subsequently, the molded package may be subjected to a curing process. As specifically indicated, the bottom side or PCB side of the molded package is exposed.

Figure 13:
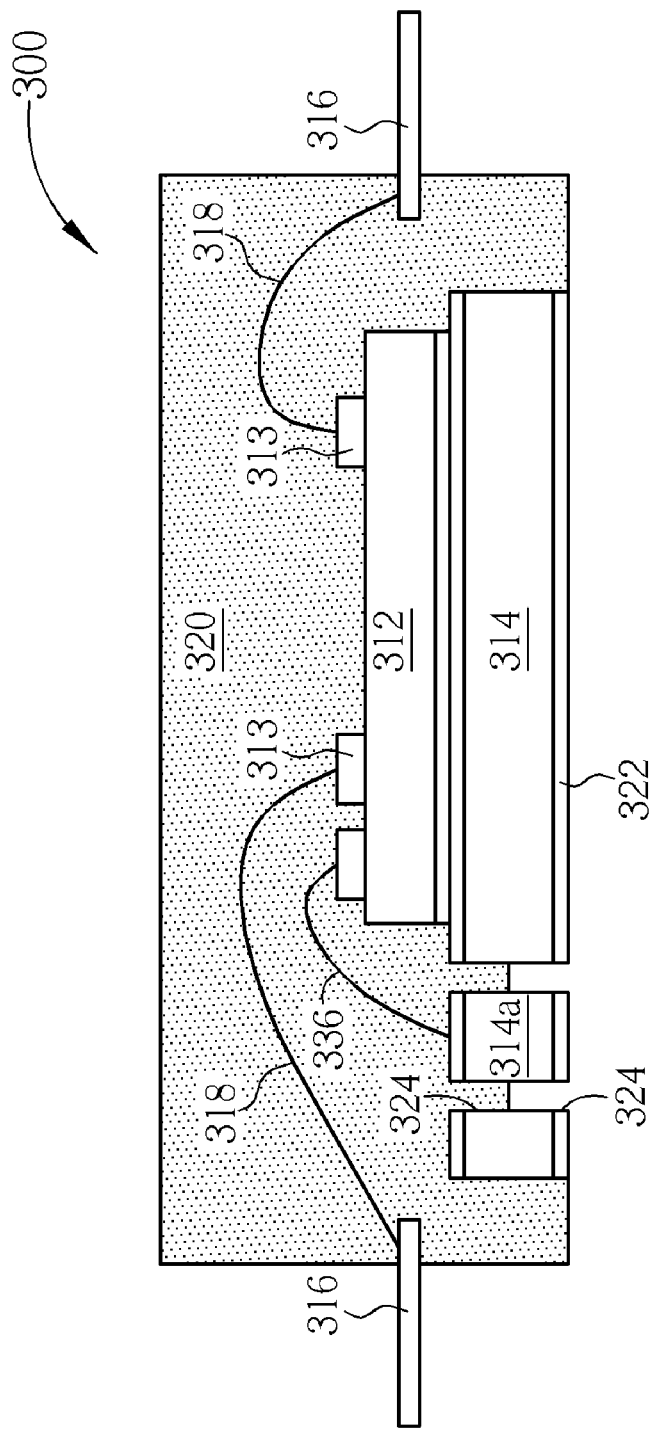

As shown in FIG. 13, after molding, the exposed PCB side of the molded package is subjected to a second half etching process to etch the remanent thickness of the die pad 314 through the corresponding slit openings 324 of the etching mask 322, thereby forming a separate pad segment 314a that is partitioned off from the die pad 314. The partitioned pad segment 314a is completely isolated from the die pad 314 and does not directly contact with the die pad 314. The secondary etching may also be replaced by a carving processing with a carving machine, which is available on carving patterns on printed circuit boards.

Figure 14:
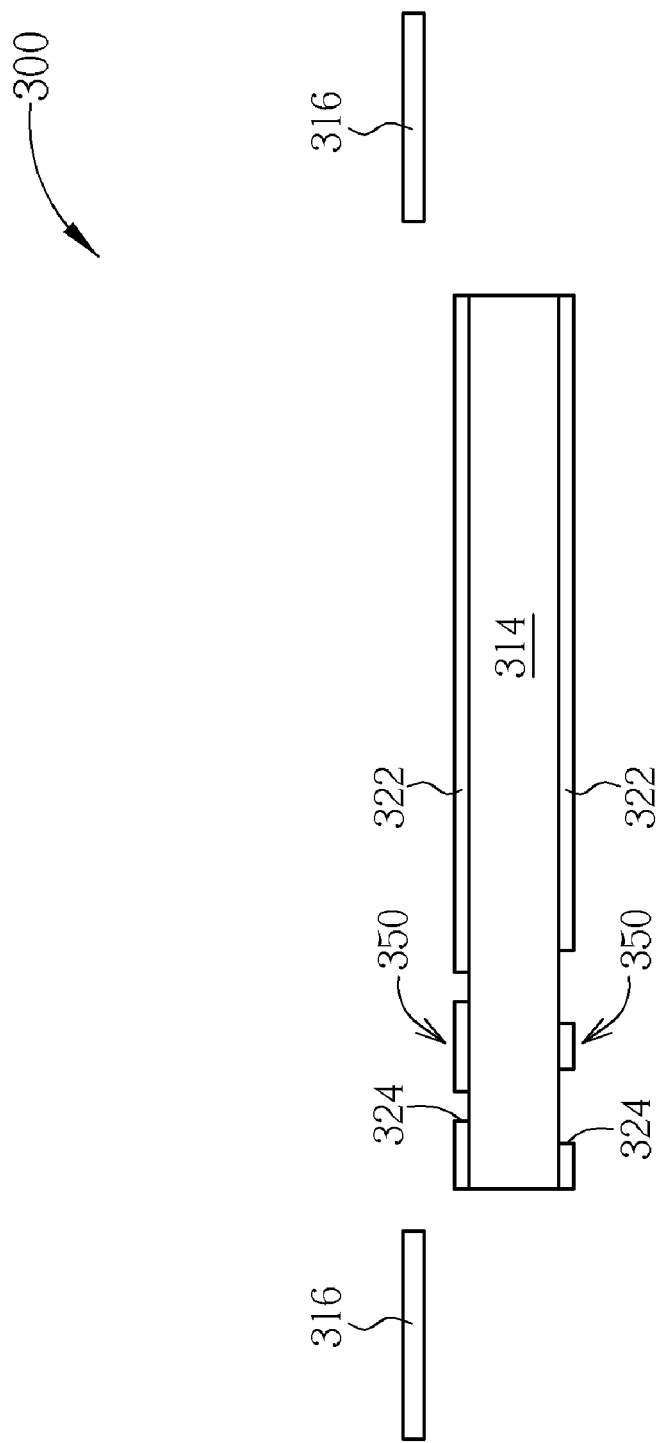
FIG. 14 to FIG. 17 are schematic, cross-sectional diagrams illustrating the intermediate steps during the fabrication of a leadframe package having the reverse T-shaped slit as set forth in FIG. 4.

FIG. 14 to FIG. 17 are schematic, cross-sectional diagrams illustrating the intermediate steps during the fabrication of a leadframe package having reverse T-shaped slit as set forth in FIG. 4 according another aspect of this invention. As shown in FIG. 14, after etching (or stamping) and plating, a leadframe 300 is provided. The leadframe 300 comprises a unitary die pad 314 and peripheral leads 316. The both sides of the die pad 314 are coated with an etching mask 322 On the exposed bottom side, the etching mask 322 includes supporting bar pattern (not shown) for provisionally connecting between the pad segment 314a and die pad 314. The etching mask 322 may be made of noble metals, metal alloys or photoresist. The etching mask 322 has slit openings 324, which define a separate pad pattern 350 to be transferred into the underlying die pad 314.

Figure 15:
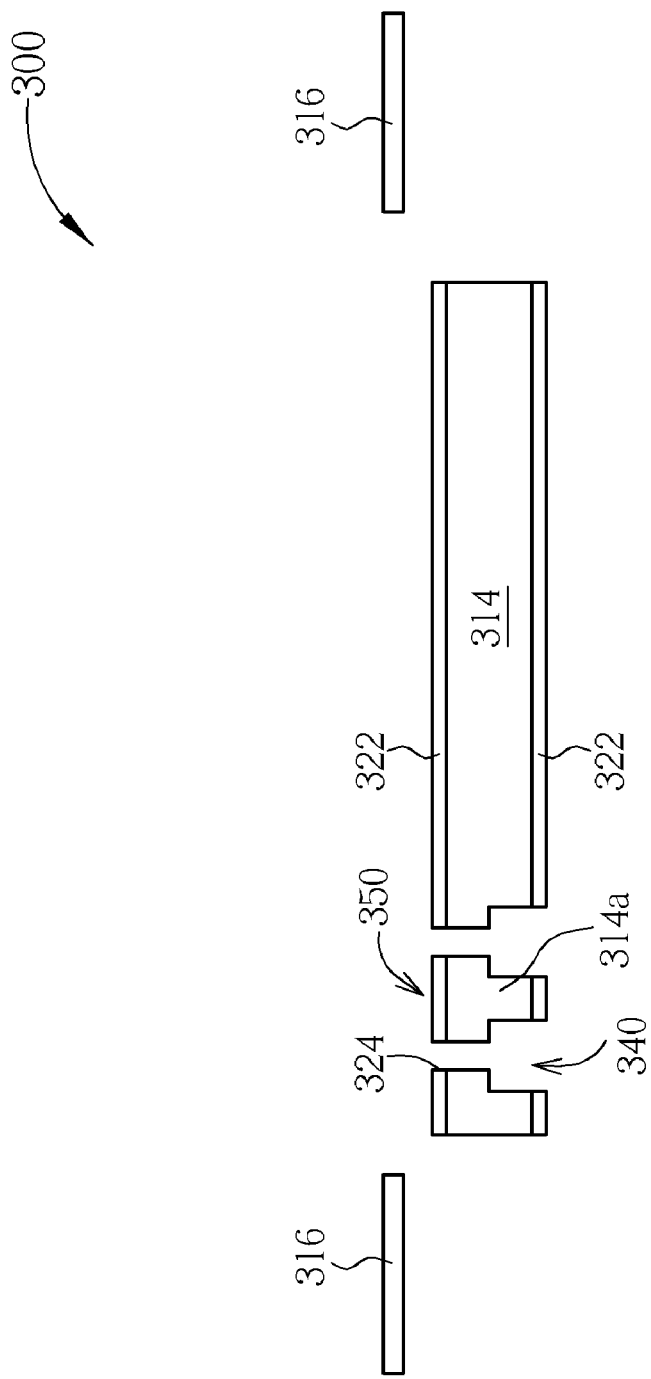

Subsequently, as shown in FIG. 15, a first etching process (including half etching from the die side and the other half etching from the bottom side of the die pad 314) is carried out on both sides of the die pad 314 to etch away the entire thickness of die pad 314 through the slit openings of the etching mask 322, thereby forming reverse T-shaped opening 340 and pad segment 314a. At this stage, the aforesaid provisional supporting bars still connect between the pad segment 314a and die pad 314 to prevent the pad segment 314a from falling off from the die pad 314. This first etching process may be accomplished in a leadframe manufacturing company. The leadframe 300 is then shipped to an assembly house.

Figure 16:
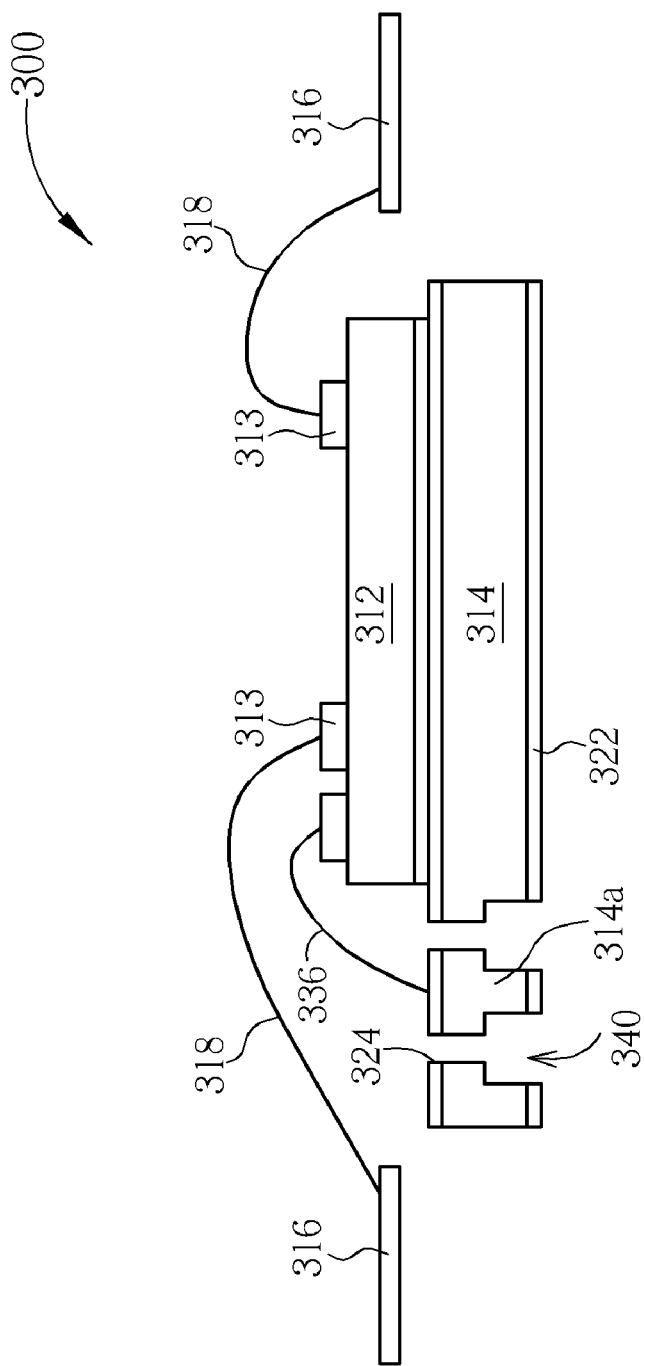

As shown in FIG. 16, in an assembly house, a semiconductor die 312 is attached onto the die pad 314. Bond wires 318 and 336 are provided to form electrically connection between the bond pads 313 and the leads 316 and between the bond pads 313 on the semiconductor die 312 and the pad segment 314a.

Figure 17:
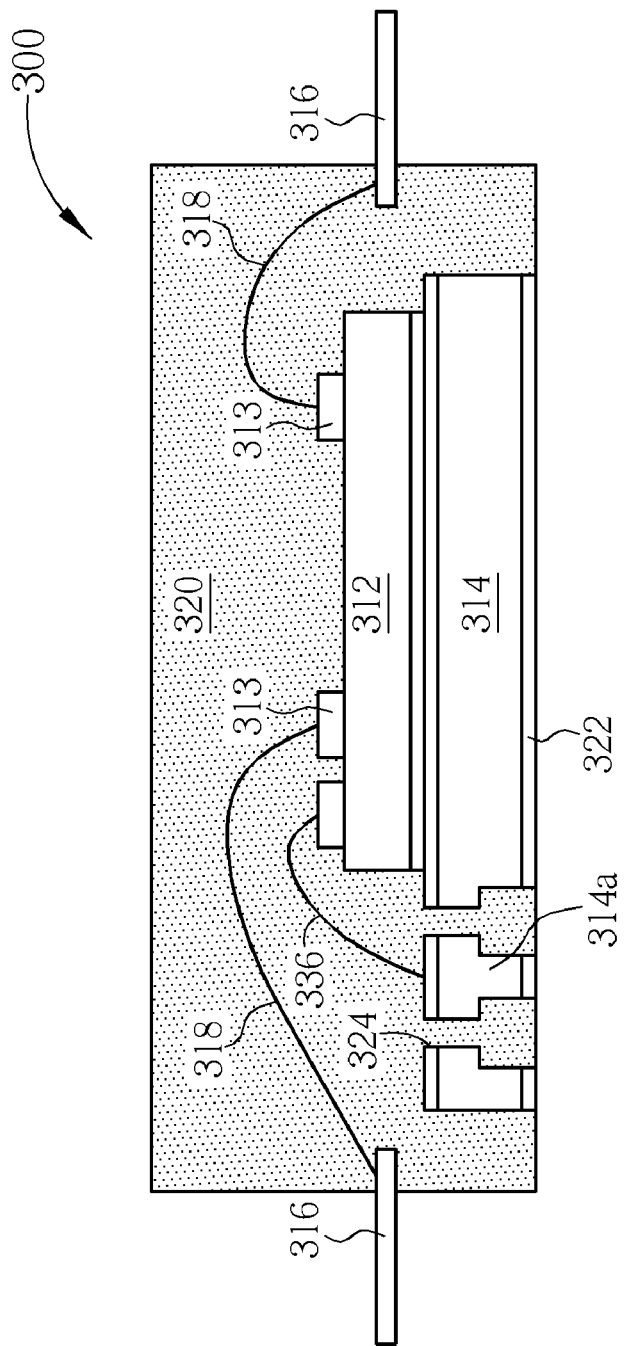

As shown in FIG. 17, after wire bonding, the entire assembly as depicted in FIG. 16 is then molded using a thermosetting compound 320. This compound may be a low-temperature hardening resin. Subsequently, the molded package may be subjected to a curing process. As specifically indicated, the bottom side or PCB side of the molded package is exposed.

Figure 18:
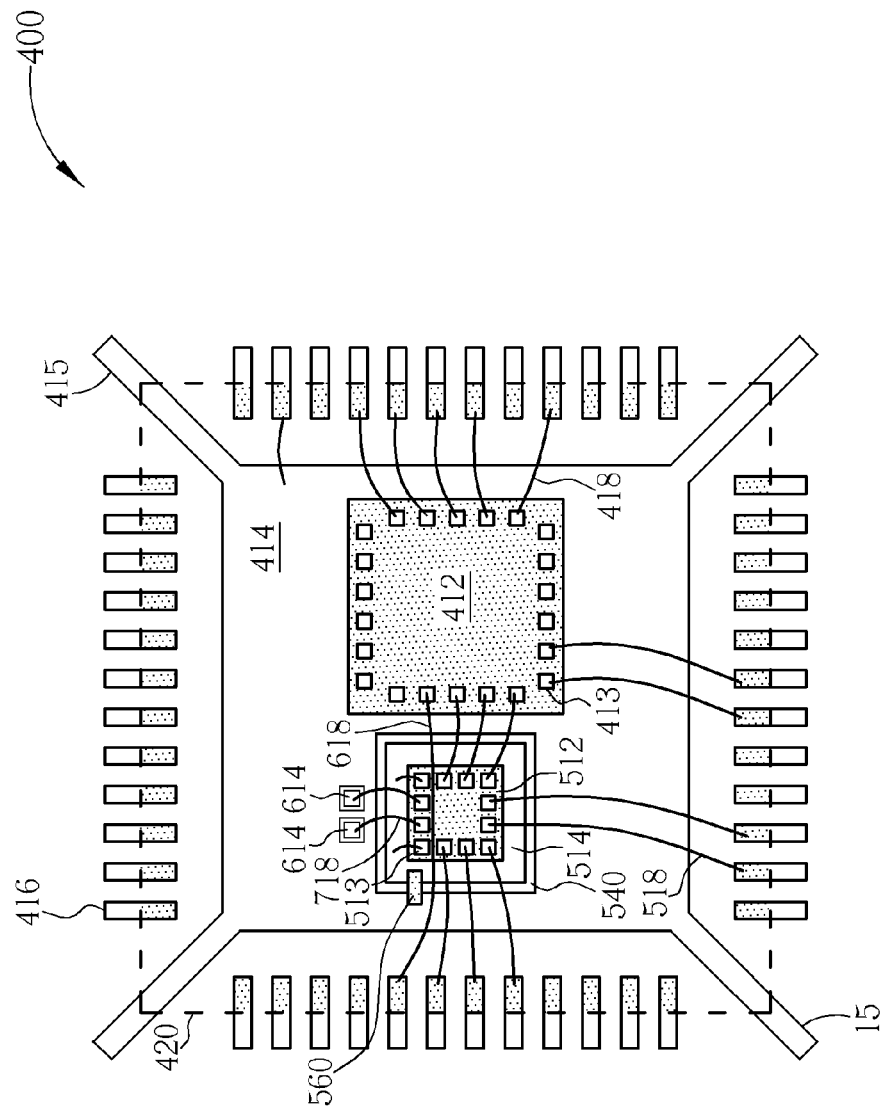
FIG. 18 illustrates a top view of a SiP leadframe package according to another preferred embodiment of this invention.

According to another preferred embodiment of the present invention, the leadframe package is an MCM (multi-chip module) or SiP (System-in-Package) containing multiple semiconductor dies and passive components in a single package. FIG. 18 illustrates a top view of such a SiP leadframe package. As shown in FIG. 18, the SiP leadframe package 400 comprises a first semiconductor die 412 that is mounted on a primary die pad 414. The primary die pad 414 has four slender supporting bars 415 extending outward from four corners of the primary die pad 414. A bottom side of the primary die pad 414 is exposed in the package body to dissipate heat generated by the semiconductor die 412. The exposed bottom side of the primary die pad 414 may be electrically connected to a ground layer of the PCB.

The first semiconductor die 412 has thereon a plurality of bond pads 413 which are electrically connected to respective leads 416 through the bond wires 418. The SiP leadframe package 400 further comprises a secondary die pad 514. A second semiconductor die 512 is mounted on the secondary die pad 514. The secondary die pad 514 is partitioned off from the primary die pad 414 and does not directly contact with the primary die pad 414. Some of bond pads 513 on the die 512 are electrically connected to respective leads 416 through the bond wires 518. According to this invention, the first semiconductor die 412 is a digital chip and the second semiconductor die 512 is an analog chip.

Likewise, a bottom side of the secondary die pad 514 is exposed in the package body to dissipate heat generated by the semiconductor die 512. The exposed bottom side of the secondary die pad 514 may be electrically connected to a ground layer such as analog ground of the PCB, which can prevent digital circuit noise from affecting the analog signal path. In addition, separate pad segments 614 both having the same pad structure 14b as set forth through FIG. 3 to FIG. 6 are provided on the primary die pad 414.

The function of the separate pad segments 614 is providing high-speed differential signals to the semiconductor die 512 such that a shorter electrical path can be established and less signal loss can be achieved. The separate pad segments 614 are isolated from the primary die pad 414 and do not need any structural support from the primary die pad 414 or from the leads 416.

Optionally, a passive component 560 is mounted on the primary die pad 414 and the secondary die pad 514 across a slit 540 between the primary die pad 414 and the secondary die pad 514. Some of the bond pads 413 are wire bonded to respective bond pads 513 on the semiconductor die 512 through bond wires 618. Some of the bond pads 513 on the second semiconductor die 512 are wire bonded to the separate pad segments 614 through bond wires 718. The entire assembly is encapsulated or molded by a molding compound 420.

Figure 19:
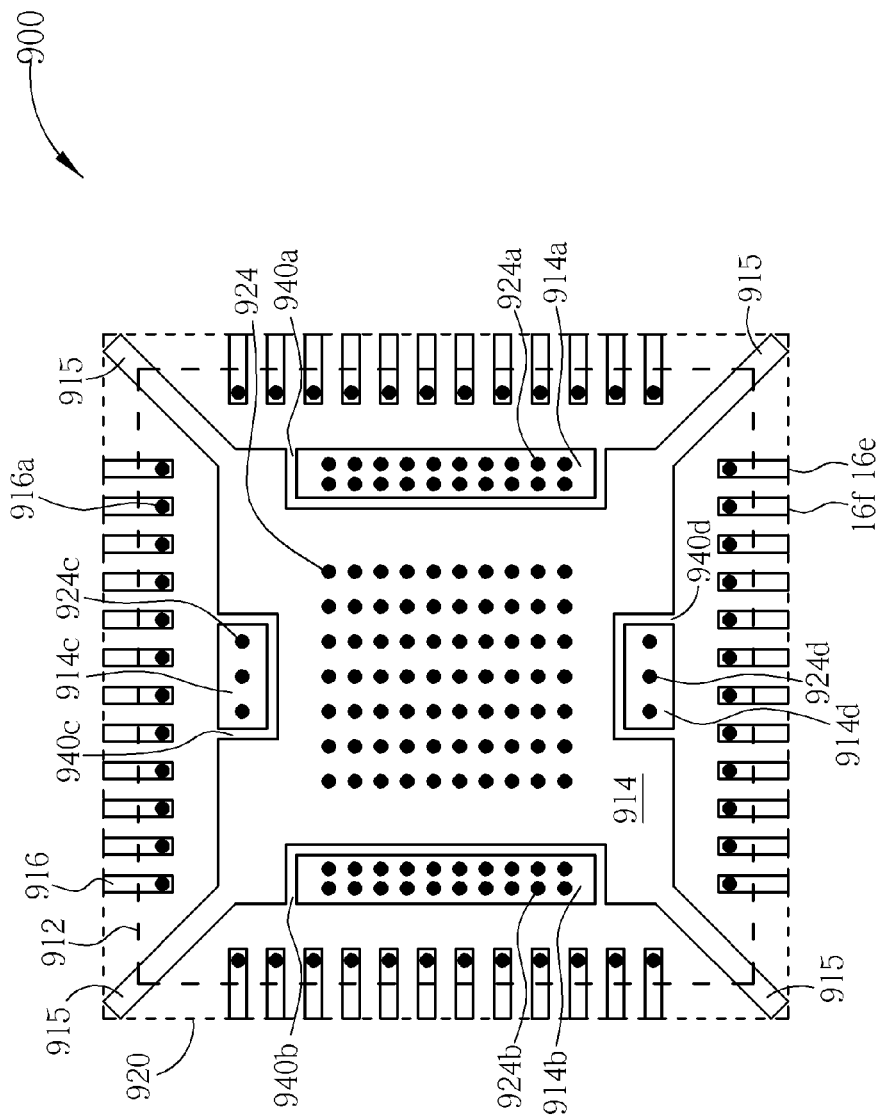
FIGS. 19 and 20 demonstrate a flip-chip leadframe package in accordance with still another preferred embodiment of this invention.
Figure 20:
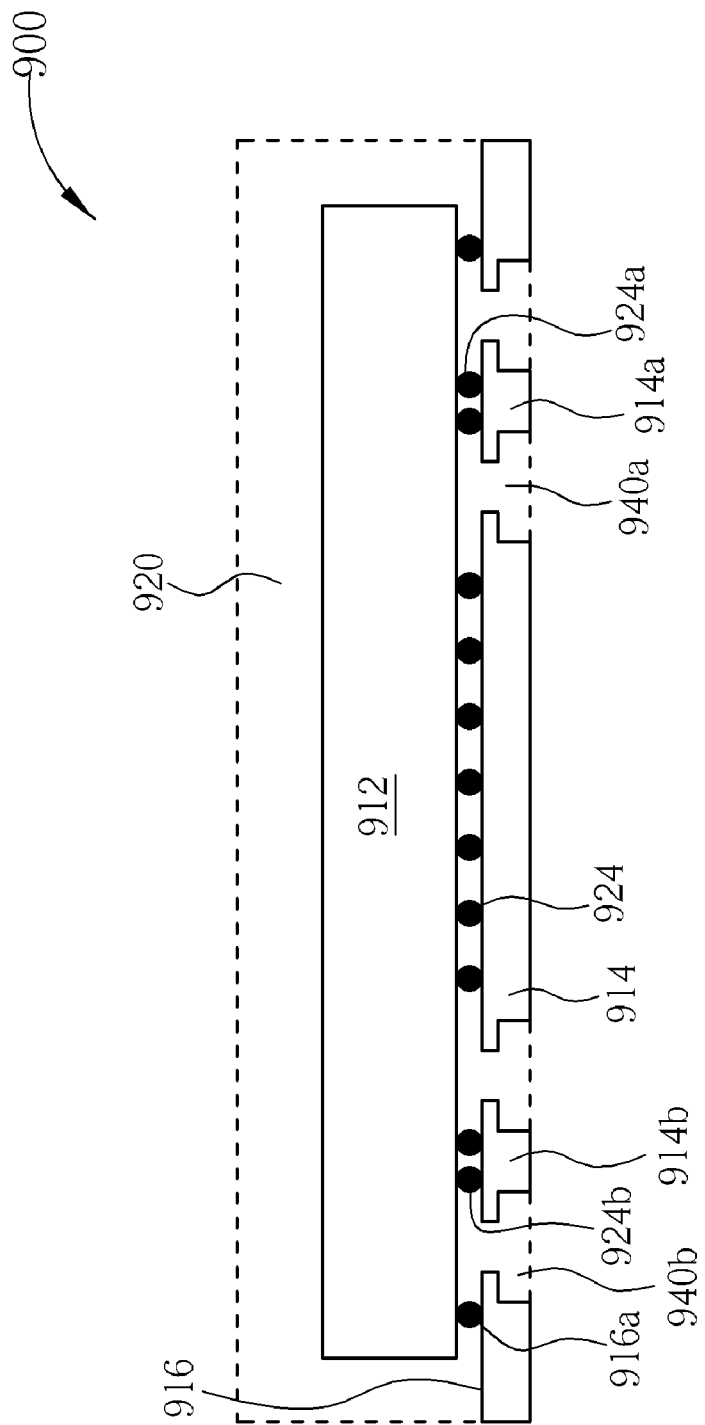

FIGS. 19 and 20 demonstrate a flip-chip leadframe package 900 in accordance with still another preferred embodiment of this invention, wherein FIG. 19 is a planar view of the flip-chip leadframe package 900 and FIG. 20 is a cross-sectional view of the flip-chip leadframe package 900. As shown in FIGS. 19 and 20, the flip-chip leadframe package 900 comprises a die pad 914 with four slender supporting bars 915 extending outward from four corners of the primary die pad 914. A bottom side of the die pad 914 is exposed in the package body. The exposed bottom side of the die pad 914 is electrically connected to a digital ground (DGND) layer of the PCB, for example. Bumps or solder balls 924 are provided on the other side, i.e., the die side, which is opposite to the exposed side of the die pad 914 for the electrical bonding between the primary die pad and a flip chip 912 mounted on the die side.

The flip-chip leadframe package 900 further comprises a plurality of suspended pad segments 914a~914d, each of which connects to a specific signal. For example, the suspended pad segment 914a is connected to a $V_{DD1}$ power signal, the suspended pad segment 914b is connected to a $V_{DD2}$ power signal, suspended pad segment 914c is connected to a $V_{DD3}$ power signal, and the suspended pad segment 914d is connected to a analog ground (AGND) signal. Bumps 924a~924d are disposed on respective suspended pad segments 914a~914d for the electrical bonding between the suspended pad segments and a flip chip 912.

The suspended pad segments 914a~914d are partitioned off from the die pad 914 and do not directly contact with the die pad 914, as previously mentioned. Further, the suspended pad segments 914a~914d are isolated from any of the plurality of leads 916. The slits 940a~940d may have a reverse T-shaped cross section as set forth in FIG. 4. A bottom side of each of the suspended pad segments 914a~914d is exposed.

Leads 916 are disposed along four sides of the die pad 914. Bumps 916a are disposed on respective leads 916 for the electrical bonding between the leads 916 and the flip chip 912. Except the bottom surfaces thereof, the flip chip 912, the die pad 914, the suspended pad segments 914a~914d and the leads 916 are encapsulated in a molding compound 920. The molding compound 920 fills the slits 940a~940d thereby holding the suspended pad segments 914a~914d firmly in place.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package product, comprising:
   a semiconductor device;
   a die pad having a primary portion, a secondary portion and a third portion, wherein the primary portion carries the semiconductor device; the second portion and the third portion provide two grounding terminals;
   multiple leads for connecting a set of signal lines wired to the semiconductor device; and
   a molding compound for encapsulating the semiconductor device, the die pad and a portion of the leads and for exposing a bottom side of the secondary and the third portions of the die pad;
   wherein the semiconductor package product further comprises a first grounding signal line for connecting a first ground circuit of the semiconductor device to the secondary portion of the die pad; and the semiconductor package product further comprises a second grounding signal line for connecting a second ground circuit of the semiconductor device to the third portion of the die pad.

2. The semiconductor package product of claim 1, wherein the first ground circuit is an analog circuit and the second ground circuit is a digital circuit of the semiconductor device.

3. The semiconductor package product of claim 1, wherein a gap between the primary portion and the secondary portion has a reverse T-shaped cross-section and is filled with the molding compound to further stabilize the die pad.

4. The semiconductor package product of claim 1, wherein a gap between the primary portion and the secondary portion has a sandglass-shaped cross-section and is filled with the molding compound to further stabilize the die pad.

5. The semiconductor package product of claim 1, wherein a gap between the primary portion and the secondary portion has an area of saw-tooth edge.

6. A semiconductor package product, comprising:
   a semiconductor device;
   a die pad having a primary portion for carrying the semiconductor device, a secondary portion and a third portion, wherein the third portion of the die pad is isolated from the primary portion and the secondary portion of the die pad;
   a plurality of leads;
   a first set of bonding wires for electrically connecting the leads and the semiconductor device; and
   a molding compound for encapsulating the semiconductor device, the die pad and a portion of the leads and for exposing a bottom side of the secondary portion and the third portion of the die pad;
   wherein the secondary portion of the die pad is electrically connected to a first grounding circuit of the semiconductor device via a second bonding wire; and the third portion of the die pad is electrically connected to a second grounding circuit of the semiconductor device via a third bonding wire.

7. The semiconductor package product of claim 6, wherein the die pad is not coplanar with the leads.

8. The semiconductor package product of claim 6, wherein a gap between the primary portion and the secondary portion of the die pad has a reverse T-shaped cross-section and is filled with the molding compound.

9. The semiconductor package product of claim 6, wherein a gap between the primary portion and the secondary portion of the die pad has a sandglass-shaped cross-section and is filled with the molding compound.

10. The semiconductor package product of claim 6, wherein a gap between the primary portion and the secondary portion of the die pad has an area of saw-tooth edge.

11. A semiconductor package product, comprising:
    a semiconductor device;
    a die pad having a primary portion for carrying the semiconductor device, and a secondary portion, wherein the secondary portion of the die pad is isolated from the primary portion of the die pad;
    a plurality of leads;
    a first set of bonding wires for electrically connecting the leads and the semiconductor device; and
    a molding compound for encapsulating the semiconductor device, the die pad and a portion of the leads and for exposing a bottom side of the secondary portion of the die pad;
    wherein the secondary portion of the die pad is electrically connected to the semiconductor device via a second bonding wire; and wherein a gap between the primary portion and the secondary portion of the die pad has a sandglass-shaped cross-section and is filled with the molding compound.

12. A semiconductor package product, comprising:
    a semiconductor device;
    a die pad having a primary portion for carrying the semiconductor device, and a secondary portion, wherein the secondary portion of the die pad is isolated from the primary portion of the die pad;
    a plurality of leads:
    a first set of bonding wires for electrically connecting the leads and the semiconductor device; and
    a molding compound for encapsulating the semiconductor device, the die pad and a portion of the leads and for exposing a bottom side of the secondary portion of the die pad;
    wherein the secondary portion of the die pad is electrically connected to the semiconductor device via a second bonding wire; and wherein a gap between the primary portion and the secondary portion of the die pad has an area of saw-tooth edge.

\* \* \* \* \*